March 5, 1957 A. A. CURRY ET AL 2,784,263

COMPRESSION AMPLIFIER

Filed Dec. 4, 1952

INVENTOR.
Arnet A. Curry
Peter S. Castro
BY
Foorman L. Mueller
Atty.

United States Patent Office 2,784,263

Patented Mar. 5, 1957

2,784,263

COMPRESSION AMPLIFIER

Arnet A. Curry, Elmhurst, and Peter S. Castro, Chicago, Ill., assignors to Motorola, Inc., Chicago, Ill., a corporation of Illinois Application December 4, 1952, Serial No. 324,048

7 Claims. (Cl. 179—171)

Figures 1, 2, 3:
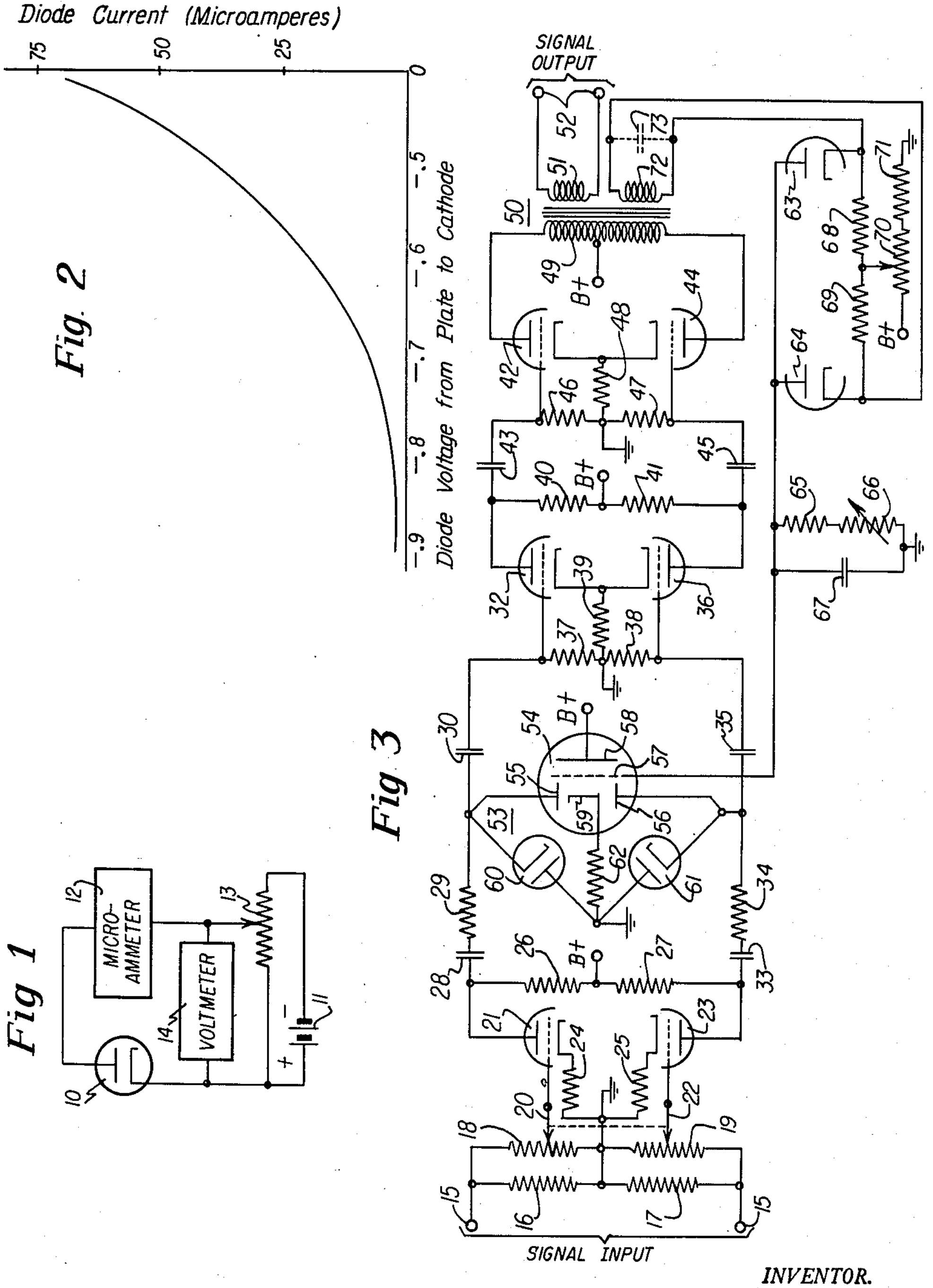

This invention relates to electronic amplifier circuits, and more particularly to an amplifier whose gain may be controlled in a new and improved manner, either automatically in accordance with the intensity of a signal translated thereby or manually.

Amplifiers having a controllable gain have been designated as compression amplifiers and have been used in various applications for many years. Most compression amplifiers of the automatic type include a regulator circuit which transforms intensity variations of the signals translated by the amplifier and appearing in its output circuit into a variable D. C. control voltage. This voltage is used to control the overall gain of the amplifier so as to compress and hold the output signal relatively constant regardless of variations in the input signal intensities within the compression range of the amplifier.

There are two general types of automatic compression amplifiers, the first using the derived control voltage to vary the attenuation of a network in the amplifier, and the second incorporating variable mu tubes and using the control voltage to control the bias of such tubes and thereby vary the gain of one or more stages of the amplifier. The second type of automatic compression amplifier is subject to many limitations such as, a restricted control range, poor overload characteristics, and a susceptibility to hum pickup. However, despite its inherent limitations, the latter has been used almost exclusively when automatic compression is desired. The chief reason for this choice is the difficulty that has been encountered in providing a suitable variable attenuator for the former type which is controllable over a wide range by small variations of the D. C. control voltage.

The present invention provides a compression amplifier of the first type referred to previously in which the intensity of signals translated by the amplifier is controlled by an attenuating network included in the amplifier. The attenuating network of the invention is constructed to be well suited for automatic control, and automatic compression may be achieved without the necessity of resorting to the second type of arrangement with its attendant disadvantages and limitations.

It is, accordingly, an object of this invention to provide a new and improved network for controlling the gain or compression of an amplifier.

A further object of the invention is to provide such an improved control network which has an extremely wide compression range, a very low distortion at any operating level, and a wide range of compression threshold control.

A still further object of the invention is to provide such an improved control network that is constructed to respond quickly to intensity increases in the signals translated by the amplifier to decrease the gain of the amplifier or, in other words, a control network having an extremely fast "attack" time.

Another object of the invention is to provide such an improved control network that is constructed to have an adjustable "decay" time, or time in which it responds to decreases in the intensity of signals translated by the amplifier to increase its gain.

A feature of the invention is the provision of a compression amplifier which includes an attenuator network including a diode for controlling the attenuation thereof, with the diode having its anode biased slightly negative with respect to its cathode, and this bias being controllable to vary the alternating-current resistance of the diode and control the gain of the amplifier.

The circuit of this invention makes use of a little known diode characteristic, that is, the shape of the current versus applied negative anode voltage curve when drawn near the region of cutoff. As will be described herein, this characteristic of the diode provides an alternating-current resistance having a wide variation for a relatively small change in control voltage. This characteristic of the diode is used in the attenuator circuit of the invention to provide an improved automatic compression amplifier.

A more specific feature of the invention is the provision of an improved compression amplifier of the above mentioned type in which the bias across the diode is controlled by a triode which, in turn, responds to an applied control voltage thereby to control the alternating-current resistance of the diode and the attenuation of the attenuating network.

Yet another feature of the invention is the provision of a push-pull amplifier which includes an attenuating network using a series of diodes connected in a bridge arrangement and each biased in the above described fashion with its anode slightly negative with respect to its cathode. The bias on the diodes is controlled in accordance with a control potential to vary their alternating-current resistance and, therefore, the attenuation of the attenuating network. The diodes are connected so that variations in the control potential are applied to the succeeding amplifier stages in parallel rather than push-pull to be cancelled in the output circuit of the amplifier. In this fashion, the compression amplifier may have a very fast attack time without the resulting rapid variations in the control potential interfering with the signals translated by the amplifier.

The above and other features of the invention which are believed to be new are set forth with particularity in the appended claims. The invention itself, however, together with further objects and advantages thereof, may best be understood by reference to the following description when taken in conjunction with the accompanying drawing in which:

Fig. 1 is a schematic diagram of a convenient circuit useful in determining the characteristic of a diode upon which the present invention is predicated, Fig. 2 is a curve showing the above mentioned characteristic of the diode, and Fig. 3 is a circuit diagram of an automatic compression amplifier incorporating the invention.

The compression amplifier of the invention includes a signal translating circuit having an attenuating network coupled thereto for attenuating signals translated thereby. The attenuating network comprises at least one discharge device having an anode and a cathode for controlling the attenuation of the network in accordance with variations in the alternating-current resistance of the device. The device has an alternating-current resistance related to the negative direct-current bias potential impressed between its anode and cathode, this resistance varying in accordance with variations in such bias from zero to a predetermined negative value. Finally, the invention includes means for impressing a negative direct-current bias potential between the anode and cathode which is variable between zero and the aforementioned predetermined negative value to control the alternating-current resistance of the device and, therefore, the attenuation of the above mentioned network.

In the circuit of Fig. 1, a diode 10 has its cathode connected to the positive terminal of a source of unidirectional potential 11, and has its anode coupled through a micro-ammeter 12 to a variable tap on potentiometer 13 connected across source 11. A voltmeter 14 is connected between the cathode of device 10 and the movable tap. The movable tap on potentiometer 13 may be moved from the extreme left-hand side of the potentiometer where voltmeter 14 registers zero along the potentiometer in steps, for example, of .1 volt as registered on the voltmeter, and the corresponding current through micro-ammeter 12 may be recorded to derive the characteristic curve of Fig. 2.

Examination of the curve of Fig. 2 reveals that the slope of this curve changes considerably with only a very small change in applied diode voltage. The A. C. resistance of the diode at any point of operation is, from definition, equal to $$R_{A.C.}=\frac{\Delta E}{\Delta I}$$

(which also corresponds to the slope of the curve at any selected operating point). It is evident from the curve that large variations in the A. C. resistance of the diode may be obtained with relatively small changes in bias voltage. For example, the A. C. resistance varies from the order of 1 megohm at an operating point of —.85 volt to the order of 2500 ohms at an operating point of —.55 volt. This provides a 400 to 1 change in A. C. resistance with a change of operating potential of only .3 volt. This factor is utilized in the present invention in the provision of an attenuating network which uses one or more diodes biased to operate on the characteristic of Fig. 2 so that the attenuation of the network may be conveniently controlled in response to a control voltage having relatively small amplitude variations.

There are some limitations, however, in utilizing the illustrated characteristic of a diode. For example, the curve is not linear and, to prevent distortion, the applied alternating current signal must be relatively small with respect to the biasing voltage that establishes the operating point. This limitation is overcome, however, in the present invention, by connecting the attenuating network into the amplifier at a point where the signals translated by the amplifier have not been amplified to any appreciable extent and have low amplitude as compared with the control voltage used to control the attenuating network.

Referring now to Fig. 3, the compression amplifier of the invention comprises a pair of input terminals 15 that may be shunted by a pair of fixed load resistors 16, 17, as determined by the input requirements, and by a pair of variable potentiometer resistors 18, 19; the junction of resistors 16 and 17 and of resistors 18 and 19 being connected to a point of reference potential or ground. Resistor 18 has a variable tap 20 which is connected to the control electrode of a triode 21, and resistor 19 has a variable tap 22 which is connected to the control electrode of a triode 23. The variable taps 20 and 22 are mechanically interconnected so as to be at all times equi-distant from ground. The cathode of triode 21 is connected to ground through a cathode resistor 24, and the cathode of triode 23 is connected to ground through a cathode resistor 25.

The anode of triode 21 is connected to the positive terminal B+ of a source of unidirectional potential through a resistor 26 and the anode of triode 23 is connected to that terminal through a resistor 27. The anode of triode 21 is also coupled through a series-connected capacitor 28, resistor 29 and capacitor 30 to the control electrode of a triode 32; whereas the anode of triode 23 is also coupled through a series-connected capacitor 33, resistor 34 and capacitor 35 to the control electrode of a triode 36. The control electrode of triode 32 is connected to ground through a grid-leak resistor 37, and the control electrode of triode 36 is connected to ground through a grid-leak resistor 38. The cathodes of triodes 32 and 36 are connected together and through a resistor 39 to ground.

The anode of triode 32 is connected to the positive terminal B+ of a source of unidirectional potential through a resistor 40, and the anode of triode 36 is connected to that terminal through a resistor 41. The anode of triode 32 is further coupled to the control electrode of a triode 42 through a coupling capacitor 43, and the anode of triode 36 is further coupled to the control electrode of a triode 44 through a coupling capacitor 45. The control electrode of triode 42 is connected to ground through a grid-leak resistor 46, and the control electrode of triode 44 is connected to ground through a grid-leak resistor 47. The cathodes of triodes 42 and 44 are connected together and through a common cathode resistor 48 to ground.

The anode of triode 42 is connected to one side of the primary winding 49 of an output transformer 50, and the anode of triode 44 is connected to the other side of the primary winding, the primary winding having a center tap connected to the positive terminal B+ of a source of unidirectional potential. Transformer 50 has a secondary winding 51 which is connected to the output terminals 52 of the amplifier.

The operation of the amplifier thus far described is well known. A signal to be amplified is impressed across input terminals 15 which supply a pair of push-pull signals to the control electrodes of triodes 21 and 23. The triodes amplify the push-pull signals and produce amplified push-pull signals across resistors 26 and 27. The amplified push-pull signals are translated by the signal translating circuit 28—30, 33—35, 37 and 38, to the control electrodes of triodes 32 and 36. The signal translating circuit has a first path which supplies one of the push-pull signals to triode 32 and a second path which supplies the other push-pull signal to triode 36. The push-pull signals are again amplified in triodes 32 and 36 and supplied to triodes 42 and 44 wherein they are once more amplified and supplied to output transformer 50, so that an amplified signal may be obtained across output terminals 52.

In accordance with the invention, an attenuating network 53 is connected between the two paths of the aforementioned signal translating circuit between triodes 21, 23 and 32, 36. The attenuating network includes an electron discharge device 54 having a first diode section including an anode 55 and a second diode section including an anode 56, and also having a triode section including a control electrode 57 and an anode 58; the latter being connected to the positive terminal B+ of a source of unidirectional potential. Discharge device 54 also has a cathode 59 which is common to its diode and triode sections. The discharge device 54 incorporating the diode and triode sections is shown merely as a convenient instrumentality, and it is to be understood that separate diodes and triodes may be utilized to replace the sections of device 54 when so desired.

The attenuating network also includes a diode 60 having its anode connected to a point of reference potential, such as ground, and its cathode connected to anode 55; the junction of the cathode of diode 50 and anode 55 being connected to the junction of resistor 29 and capacitor 30 of one of the paths of the aforementioned signal translating circuit. Attenuating network 53 also includes a diode 61 having its anode connected to ground and its cathode connected to the anode 56, the junction of the cathode of diode 61 and anode 56 being connected to the junction of resistor 34 and capacitor 35 of the other path of the aforementioned signal translating circuit. Cathode 59 of device 54 is connected to ground through a resistor 62. Diodes 55, 56 and 60, 61 may be of any suitable type exhibiting the desired characteristics. Specifically, these diodes may be vacuum tubes, copper oxide rectifiers, silicon or germanium crystals, or the like.

It is evident that the current flow through the triode section of discharge device 54 may be controlled by the signal impressed on control electrode 57, and that such current flow produces a variable voltage across cathode resistor 62 which is positive with respect to ground. Assume, for purposes of explanation, that the control voltage applied to control electrode 57 is such that a voltage of 1 volt appears across resistor 62. This voltage is divided between diodes 55 and 60, so that the anode of diode 55 and the cathode of diode 60 are established at .5 volt, whereas the anode of diode 60 is established at ground and the cathode 59 is established at 1 volt. In this fashion, a negative bias of .5 volt is impressed across diode 55, and a negative bias voltage of .5 volt is impressed across diode 60. This causes the diodes 55 and 60 to operate at a point on their characteristic illustrated in Fig. 2, and both exhibit a certain A. C. resistance between the first path of the signal translating circuit and ground. In exactly the same way, the diode 56 and diode 61 exhibit substantially the same A. C. resistance between the second path of the signal translating circuit and ground. In this fashion, the signals translated from triodes 21, 23 to triodes 32, 36 are attenuated by a certain amount depending upon the A. C. resistance of the diodes.

Any slight variation in the control signal on control electrode 57 causes a corresponding variation in the voltage across resistor 62 shifting the bias on the diodes along the characteristic of Fig. 2. This changes the A. C. resistance of the diodes and the resulting attenuation of the attenuating network to the aforementioned signals translated by the signal translating circuit, so that an extremely efficient and sensitive gain or compression control for the amplifier is obtained.

The location of attenuating network 53 between the first and second stages of the amplifier assures that the signals translated by the amplifier have relatively low intensity as impressed on the attenuating network compared with the bias potential developed across resistor 62 so that the A. C. resistance of the diodes is essentially linear for all practical purposes.

The D. C. control potential for control electrode 57 may be obtained from any suitable variable voltage source for manual control of the amplifier, or it may be obtained for automatic control from the circuit which is now to be described. The automatic control circuit includes an inductance winding 72 coupled to transformer 50 and having one side connected to the cathode of a rectifier device 63 and its other side connected to the cathode of a rectifier device 64. The anodes of rectifier devices 63 and 64 are connected together and to ground through a network comprising a pair of series resistors 65, 66 shunted by a capacitor 67.

The cathodes of devices 63 and 64 are connected together through a pair of series-connected resistors 68 and 69. The junction of resistors 68 and 69 is connected to a variable tap on a potentiometer resistor 70, the latter resistor being connected to ground and through a resistor 71 to the positive terminal B+ of a source of unidirectional potential. The junction of the anodes of devices 63, 64 and network 65—67 is connected to control electrode 57 of discharge device 54.

The output signals in transformer 50 are induced in winding 72 and supplied to devices 63 and 64 to be rectified therein so as to produce a unidirectional control voltage across network 65—67. The control voltage has amplitude variations corresponding to variations in the average intensity of the signals translated by the amplifier to output terminals 52. The control voltage developed across network 65—67 is applied to control electrode 57 to control the attenuation of attenuating network 53 in the previously described manner and maintain the signal output of the amplifier essentially constant within the compression range.

Under some conditions, it has proven desirable to transmit a tone of a selected frequency with the signals to be amplified by the amplifier, such a tone having an amplitude representing the average intensity of the signals. With such an arrangement, winding 72 may be shunted by a capacitor 73 (shown dotted) to form a frequency selective network which is tuned to accept only the tone so that it, rather than the signals themselves, is used to control the compression of the amplifier.

Capacitor 67 is chosen to have a relatively low capacitive value so that it may quickly reach a fully charged condition. This causes the compression control circuit of this invention to have an extremely fast attack time since the network of devices 63 and 64 responds almost instantaneously to intensity variations in the output circuit of the amplifier to charge the capacitor so as to control alternating network 53 and therefore the compression of the amplifier. Moreover, the decay time of the circuit may be controlled by adjustment of variable resistor 66 which determines the time constant of network 65–67. The decay time is usually set so that a weak signal appearing immediately after a very strong signal is not masked out but the amplifier regains full amplification for such weak signal. However, the decay time is not made so short that there is a rise of gain, with a corresponding increase in noise, between each spoken word.

With the above arrangement of extremely fast attack time and moderately fast decay time, the control potential appearing across network 65—67 may be subject to rapid amplitude variations producing signals within the audio band. In order that the extremely fast attack time may be maintained without the last mentioned signals producing distortion, the circuit is such that the control voltage variations appear in the amplifier circuit so as to be applied in parallel to triodes 32 and 36. These variations cancel, therefore, in the output circuit of the amplifier, and a fast attack time may be maintained without the ancillary disadvantages of instability and distortion.

The rectifying devices 63 and 64 are biased by means of network 68—71, and this bias may be controlled by adjustment of the movable tap on resistor 70 to provide an adjustable compression threshold for output signal intensities. Moreover, variable taps 20, 22 may be adjusted to control the compression threshold with respect to input signal intensities.

The invention provides, therefore, a new and improved network for controlling the compression of an amplifier in a new and highly efficient fashion that is not subject to the limitations of the prior art devices of this type. In a constructed embodiment of the invention, the attack time of the amplifier was found to be almost instantaneous being less than 3 milliseconds. An increase in input signal by 50 db was found to cause the output signal to increase only 4.5 db. The input signal level at which compression took effect was varied by taps 20 and 22 from −40 dbm. to 0 dbm. without in any way affecting the compression characteristic. In addition, adjustment of the tap on resistor 70 was found to hold the output signal at any level between 0 dbm. and +12.5 dbm. without in any way affecting other characteristics of the compression network. Moreover, the range of adjustment of the decay time extended from 26 milliseconds to .3 second which is more than sufficient for all practical applications of the invention.

While a particular embodiment of the invention has been shown and described, modifications may be made and it is intended in the appended claims to cover all such modifications as fall within the true spirit and scope of the invention.

We claim:

1. In a compression amplifier, a signal translating circuit and an attenuating network coupled to said circuit for attenuating signals translated thereby, said attenuating network including in combination, a first discharge device having an anode connected to a point of reference potential and having a cathode, a second discharge device having an anode connected to the cathode of said first device, a connection extending from the junction of the cathode of said first device and the anode of said second device to the aforesaid signal translating circuit, a third discharge device having an anode connected to a source of positive potential and having a control electrode, cathode means included in said second and third devices, said first and second discharge devices exhibiting relatively low alternating-current resistance when the respective anodes thereof are biased positively with respect to the respective cathodes thereof and further exhibiting an alternating-current resistance that varies from a relatively low value to a relatively high value when said respective cathodes are biased increasingly positively with respect to said respective anodes, an impedance connecting said cathode means to said point of reference potential, and a bias control network for impressing a control signal on the control electrode of said third device to establish across said impedance a positive bias potential with respect to said point of reference potential variable between zero and a predetermined value to control the alternating-current resistance of said first and second discharge devices and the attenuation of said attenuating network.

2. In a compression amplifier, a signal translating circuit and an attenuating network coupled to said circuit for attenuating signals translated thereby, said attenuating network including in combination, a first discharge device having a diode section and a triode section, said diode section having an anode, said triode section having an anode connected to a source of positive potential and further having a control electrode, and said first discharge device having a cathode common to said diode and triode sections, a second discharge device having a cathode connected to the anode of said diode section and having an anode connected to a point of reference potential, a connection extending from the junction of the anode of said diode section and the cathode of said second device to the aforesaid signal translating circuit, said diode section and said second discharge device exhibiting relatively low alternating-current resistance when the respective anodes thereof are biased positively with respect to the respective cathodes thereof and further exhibiting an alternating-current resistance that varies from a relatively low value to a relatively high value when said respective cathodes are biased increasingly positively with respect to said respective cathodes, an impedance connecting the common cathode of said first device to said point of reference potential, and a bias control network for impressing a control signal on the control electrode of said triode section to establish a positive bias potential with respect to said point of reference potential across said impedance variable between zero and a predetermined value to control the alternating-current resistance of said first and second discharge devices and the attenuation of said attenuating network.

3. In a compression amplifier, an input circuit, an output circuit, a signal translating circuit interposed between said input and output circuits, and an attenuating network for attenuating signals translated by said signal translating circuit including in combination, a first discharge device having an anode, a second discharge device having a cathode connected to the anode of said first device and having an anode connected to a point of reference potential, a connection extending from the junction of the anode of said first device and the cathode of said second device to the aforesaid signal translating circuit, a third discharge device having an anode connected to a source of positive potential and having a control electrode, cathode means included in said first and third devices, said first and second discharge devices exhibiting relatively low alternating-current resistance when the respective anodes thereof are biased positively with respect to the respective cathodes thereof and further exhibiting an alternating-current resistance that varies from a relatively low value to a relatively high value when said respective cathodes are biased increasingly positively with respect to said respective anodes, an impedance connecting the cathode means of said first and third devices to said point of reference potential, and a bias control network coupled to the aforesaid output circuit for developing a unidirectional control potential in response to signals translated by the amplifier and having amplitude variations corresponding to intensity variations of such signals, said bias control network including means impressing said control potential on the control electrode of said third device to establish a positive bias potential with respect to said point of reference potential across said impedance to control the alternating-current resistance of said first and second discharge devices and the attenuation of said attenuating network in response to amplitude variations of signals appearing in the aforesaid output circuit.

4. In a compression amplifier, a push-pull input circuit, a push-pull output circuit, a signal translating circuit interposed between said input and output circuits having two separate paths for translating push-pull signals from said input circuit to said output circuit, and an attenuating network for attenuating signals translated by said signal translating circuit including in combination, a first discharge device having a pair of diode sections and a triode section, said diode sections each having an anode, said triode section having an anode connected to a source of positive potential and further having a control electrode, and said first discharge device having a cathode common to said diode and triode sections, a second discharge device having a cathode connected to the anode of one of said diode sections and having an anode connected to a point of reference potential, a connection extending from the junction of the anode of said one diode section and the cathode of said second device to one of the aforesaid paths, a third discharge device having a cathode connected to the anode of the other of said diode sections and having an anode connected to said point of reference potential, a connection extending from the junction of the anode of said other diode section and the cathode of said third device to the other of the aforesaid paths, said diode sections and said second and third discharge devices exhibiting relatively low alternating-current resistance when the respective anodes thereof are biased positively with respect to the respective cathodes thereof and further exhibiting an alternating-current resistance that varies from a relatively low value to a relatively high value when said respective cathodes are biased increasingly positively with respect to said respective anodes, an impedance connecting the common cathode of said first discharge device to said point of reference potential, a network coupled to the aforesaid output circuit for developing a unidirectional control potential in response to signals translated by the amplifier and having amplitude variations corresponding to amplitude variations of such signals, and a bias control network for impressing said control potential on the control electrode of said triode section to establish a positive bias potential with respect to said point of reference potential across said impedance to control the attenuation of said attenuating network in response to amplitude variations of signals appearing in the aforesaid output circuit.

5. In a compression amplifier, an input circuit, an output circuit, a signal translating circuit interposed between said input and output circuits, and an attenuating network for attenuating signals translated by said signal translating circuit including in combination, a first discharge device having an anode, a second discharge device having a cathode connected to the anode of said first device and having an anode connected to a point of reference potential, a connection extending from the junction of the anode of said first device and the cathode of said second device to the aforesaid signal translating circuit, a third discharge device having an anode connected to a source of positive potential and having a control electrode, a cathode means included in said first and third devices, said first and second discharge devices exhibiting relatively low alternating-current resistance when the respective anodes thereof are biased positively with respect to the respective cathodes thereof and further exhibiting an alternating-current resistance that varies from a relatively low value to a relatively high value when said respective cathodes are biased increasingly positively with respect to said respective anodes, an impedance connecting said cathode means to said point of reference potential, a frequency selective network coupled to the aforesaid output circuit for developing a unidirectional control potential in response to a tone signal translated by the amplifier, said tone signal having a frequency corresponding to the selective frequency of such network, and said control potential having amplitude variations corresponding to intensity variations of such tone signal, and a bias control network for impressing said control potential on the control electrode of said third device to establish a positive bias potential with respect to said point of reference potential across said impedance to control the alternating-current resistance of said first and second discharge devices and the attenuation of said attenuating network.

6. In a compression amplifier, an input circuit, an output circuit, a signal translating circuit interposed between said input and output circuits, and an attenuating network for attenuating signals translated by said signal translating circuit including in combination, a first discharge device having an anode, a second discharge device having cathode means connected to the anode of said first device and having an anode connected to a point of reference potential, a connection extending from the junction of the anode of said first device and the cathode of said second device to the aforesaid signal translating circuit, a third discharge device having an anode connected to a source of positive potential and having a control electrode, cathode means included in said first and third devices and cooperating with the other electrodes thereof, said first and second discharge devices exhibiting an alternating current resistance that varies from a relatively low value to a relatively high value when the respective cathode means thereof are biased increasingly positively with respect to the respective anodes thereof, an impedance connecting the cathode means of said first and third devices to said point of reference potential, and a bias control network coupled to the aforesaid output circuit for developing a unidirectional control potential in response to signals translated by the amplifier and having amplitude variations corresponding to intensity variations of such signals, said bias control network including condenser means across which said control potential is developed and variable resistor means connected across said condenser means to control the decay of the control potential, said bias control network including means impressing said control potential on the control electrodes of said third device to establish a bias potential across said impedance which is positive with respect to said point of reference potential to control the alternating-current resistance of said first and second discharge devices and the attenuation of said alternating network in response to amplitude variations of signals appearing in the aforesaid output circuit.

7. In a compression amplifier, an input circuit, an output circuit, a signal translating circuit interposed between said input and output circuits, and an attenuating network for attenuating signals translated by said signal translating circuit including in combination, a first discharge device having an anode, a second discharge device having cathode means connected to the anode of said first device and having an anode connected to a point of reference potential, a connection extending from the junction of the anode of said first device and the cathode of said second device to the aforesaid signal translating circuit, a third discharge device having an anode connected to a source of positive potential and having a control electrode, cathode means included in said first and third devices cooperating with the other electrode thereof, said first and second discharge devices exhibiting an alternating current resistance that varies from a relatively low value to a relatively high value when the respective cathode means thereof are biased increasingly positively with respect to the associated anodes thereof, impedance means connecting the cathode means of said first and third devices to said point of reference potential, and a bias control network for impressing a bias potential on the control electrode of said third device to establish a bias potential across said impedance means which is positive with respect to said point of reference potential to control the alternating-current resistance of said first and second discharge devices, said bias control network including a portion coupled to the aforesaid output circuit for developing a unidirectional control potential in response to signals translated by the amplifier which exceed a predetermined value and having amplitude variations corresponding to intensity variations of such signals above the predetermined value, said bias potential being varied by said control potential to control the attenuation of said attenuating network in accordance with amplitude variations of signals appearing in the aforesaid output circuit which exceed the predetermined value.

References Cited in the file of this patent

UNITED STATES PATENTS

| | | |
|---|---|---|
| 2,193,966 | Jones | Mar. 19, 1940 |
| 2,329,558 | Scherbatskoy | Sept. 14, 1943 |
| 2,511,468 | Harrison | June 13, 1950 |
| 2,528,885 | Hendricks | Nov. 7, 1950 |
| 2,557,009 | Purington | June 12, 1951 |
| 2,557,888 | Olson | June 19, 1951 |
| 2,663,002 | McManis et al. | Dec. 15, 1953 |
| 2,713,620 | Tilley | July 19, 1955 |

FOREIGN PATENTS

| | | |
|---|---|---|
| 529,044 | Great Britain | Nov. 13, 1940 |